United States Patent
Bedeschi et al.

(10) Patent No.: US 10,403,336 B2
(45) Date of Patent: Sep. 3, 2019

(54) TECHNIQUES FOR PRECHARGING A MEMORY CELL

(71) Applicant: Micron Technology, Inc., Boise, ID (US)

(72) Inventors: Ferdinando Bedeschi, Biassono (IT); Umberto Di Vincenzo, Capriate San Gervasio (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/857,091

(22) Filed: Dec. 28, 2017

(65) Prior Publication Data

US 2019/0206455 A1   Jul. 4, 2019

(51) Int. Cl.
*G11C 7/12* (2006.01)
*G11C 11/22* (2006.01)

(52) U.S. Cl.
CPC ............. *G11C 7/12* (2013.01); *G11C 11/221* (2013.01); *G11C 11/2255* (2013.01)

(58) Field of Classification Search
None
See application file for complete search history.

(56) References Cited

U.S. PATENT DOCUMENTS

| 6,198,652 | B1* | 3/2001 | Kawakubo | G11C 11/22 257/295 |
| 7,366,004 | B2* | 4/2008 | Miyamoto | G11C 11/22 365/145 |
| 2001/0040814 | A1* | 11/2001 | Takashima | G11C 11/22 365/145 |

(Continued)

OTHER PUBLICATIONS

ISA/KR, International Search Report and Written Opinion of the International Searching Authority, Int'l Appl. No. PCT/US2018/064860, dated Apr. 1, 2019, Korean Intellectual Property Office, Seo-gu, Daejeon, Republic of Korea, 13 pgs.

*Primary Examiner* — Douglas King
(74) *Attorney, Agent, or Firm* — Holland & Hart LLP

(57) ABSTRACT

Methods and devices for techniques for precharging a memory cell are described. Precharging a memory cell while the memory cell is coupled with its digit line may reduce a total duration of an access operation thereby reducing a latency associated with accessing a memory device. During a read operation, the memory device may select a word line to couple the memory cell with a selected digit line. Further, the memory device may selectively couple the selected digit line with a reference digit line that is to be precharged to a given voltage. A difference in voltage between the selected digit line and the reference digit line at the completion of precharging may represent a signal indicative of a logic state of the memory cell. The memory device may use a capacitor precharged to a first voltage to capture the signal. In some cases, the memory device may continue to perform a self-reference operation using the same memory cell, the selected digit line, and the reference digit line to produce a reference signal using the capacitor precharged to a different voltage. A similar precharging steps may be repeated during the self-reference operation. The selected word line may remain activated during the read operation and the self-reference operation.

21 Claims, 10 Drawing Sheets

(56) References Cited

U.S. PATENT DOCUMENTS

| | | |
|---|---|---|
| 2003/0076704 A1* | 4/2003 | Ashikaga ................ G11C 11/22 |
| | | 365/145 |
| 2006/0164878 A1 | 7/2006 | Nishihara et al. |
| 2007/0047288 A1* | 3/2007 | Shiga ...................... G11C 11/22 |
| | | 365/145 |
| 2012/0170348 A1 | 7/2012 | Clinton et al. |
| 2014/0211533 A1 | 7/2014 | Khanna et al. |
| 2016/0027488 A1 | 1/2016 | Kim |
| 2017/0133076 A1 | 5/2017 | Johnson |

\* cited by examiner

TECHNIQUES FOR PRECHARGING A MEMORY CELL

BACKGROUND

The following relates generally to operating a memory array and more specifically to techniques for precharging a memory cell.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Figure 1:
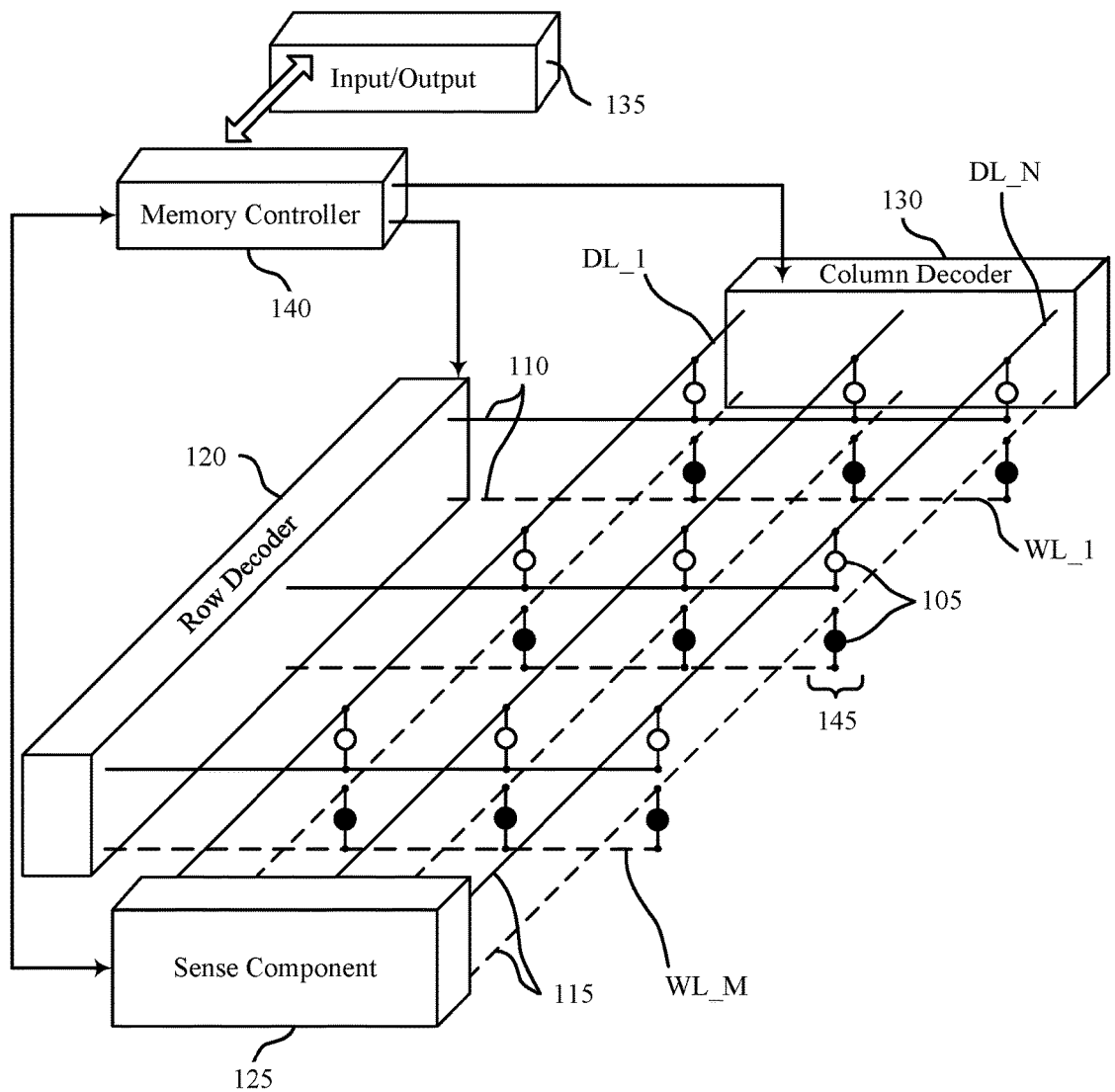
FIG. 1 illustrates an example of a memory array that supports techniques for precharging a memory cell in accordance with embodiments of the present disclosure.

In some memory devices a digit line may need to be precharged before coupling a selected memory cell with the digit line during an access operation (e.g., a read operation or a write operation). Such a precharge may add to a total duration needed to perform the access operation and may therefore increase a latency between receiving a memory command and executing the memory command.

Techniques for precharging a memory cell while a memory cell is coupled with a digit line are described herein. Precharging a memory cell while that cell is coupled with its digit line may reduce the total duration of the access operation thereby reducing the latency of the memory device and a power consumed by the access operation. When precharging a digit line that is coupled with the memory cell, a precharge circuit may need to account for the additional electrical load of the memory cell. For example, a voltage source that is configured to precharge a digit line to a first voltage (e.g., 1 volt), may precharge the digit line coupled with the memory cell to a second voltage (e.g., 0.8 volts) less than the first voltage. To account for the memory cell during the precharge, the memory device may selectively couple the digit line with a reference digit line and a precharge capacitor during various portions of the precharge. Using the reference digit line and the precharge capacitor, the memory device may be configured to precharge the digit line to its desired level while the digit line is coupled with the memory cell.

In some cases, operating characteristics a memory cell may vary over time thereby affecting the voltage levels stored on the memory cell. As a result, a fixed reference scheme may not be suitable to enable a robust read operation to work for both fresh and aged memory cells. A legacy self-referencing scheme may provide an adequate reference that mitigates issues associated with the fixed referencing scheme as the memory cell ages or its operating characteristics are altered. In some cases, however, the legacy self-referencing scheme requires deactivating a word line associated with a memory cell after the memory cell and a digit line discharges. Such toggling (e.g., deactivating and activating) of a word line between a read operation and a self-reference operation may cause a transient delay of the self-reference read operation. In some cases, the transient delay may result in the total duration of the access operation being longer (e.g., a minimum number of clock cycles between opening a row of memory cells associated with a word line and accessing digit lines associated with the memory cells).

Techniques for precharging a memory cell are provided herein to enable a self-referencing scheme without having to toggle a word line associated with a memory cell. The memory device may precharge a reference digit line to a given voltage value using a precharge circuit that also precharges a selected digit line coupled to a memory cell (e.g., a word line associated with the memory cell is activated). Subsequently, a precharged capacitor may be connected to the selected digit line coupled to the memory cell to provide an additional amount of charge to complete precharging of the selected digit line to the given voltage value. The additional amount of charge may be attributed to an amount of charge required by the memory cell and dependent on a logic status of the memory cell (e.g., a logic state of 1 or a logic state of 0). While a signal from the memory cell (e.g., the additional amount of charge provided by the capacitor) is developed and captured at a first node of a sense component, the word line associated with the memory cell remains activated without having to toggle, thus eliminating the transient delay associated with discharging and charging the word line.

After the signal from the memory cell has been captured, in some embodiments, a self-reference operation may follow. The self-reference operation may include resetting the selected memory cell, the selected digit line associated with the selected memory cell, and the reference digit line. Subsequently, the reference digit line and the selected digit line coupled to the memory cell may be precharged again for the self-reference operation using the precharge circuit by repeating similar steps described above. As the memory cell has been reset (e.g., the memory cell to have a logic state of 1), the signal from the memory cell during the self-reference operation may need an offset to function as a reference signal (e.g., to discern whether the signal captured at the first node of the sense component corresponds to a logic state of 1 or 0). In order to provide the offset, the capacitor may be precharged to a different value than the value during the read operation to generate the reference signal when connected to the memory cell. The reference signal may then be captured at a second node of the sense component. The sense component may latch the logic state of the memory cell by comparing the signal captured at the first node to the reference signal captured at the second node. While the reference signal from the memory cell is developed and captured at the second node of the sense component, the word line associated with the memory cell may remain activated without having to toggle, thus eliminating the transient delay associated with discharging and charging the word line.

The techniques for precharging a memory cell may provide advantages to improve memory devices. The precharging techniques utilize the selected memory cell of a read operation to generate a reference signal for the read operation thus mitigating issues associated with variable electrical characteristics between the memory cell to read and a reference memory cell providing the reference signal (e.g., statistical process variations or different aging between a memory cell to read and a reference memory cell). Further, the precharging techniques may use the same two digit lines (e.g., a reference digit line and a digit line coupled to a memory cell to read) while generating a signal to read and a reference signal from the memory cell, thus reducing sources of variations associated with various circuit components (e.g., a precharge circuit associated with the reference digit line, another precharge circuit associated with the digit line coupled to the memory cell, a transistor configured to couple the two digit lines).

Features of the disclosure introduced above are further described below in the context of FIGS. 1 through 3. Specific examples are then described for FIGS. 4 through 6. These and other features of the disclosure are further illustrated by and described with reference to apparatus diagrams, system diagrams, and flowcharts that relate to techniques for precharging a memory cell.

FIG. 1 illustrates an example of a memory array 100 that supports techniques for precharging a memory cell in accordance with embodiments of the present disclosure. FIG. 1 is an illustrative schematic representation of various components and features of the memory array 100. As such, it should be appreciated that the components and feature of the memory array 100 are shown to illustrate functional interrelationships, not their actual physical positions within the memory array 100. Memory array 100 may also be referred to as an electronic memory apparatus or device. Memory array 100 includes memory cells 105 that are programmable to store different states. In some cases, each memory cell 105 may be a ferroelectric memory cell that may include a capacitor with a ferroelectric material as the insulating material. In some cases, the capacitor may be referred to as a ferroelectric container. Each memory cell 105 may be programmable to store two states, denoted as a logic 0 and a logic 1. Each memory cell 105 may be stacked on top of each other resulting in two-decks of memory cell 145. Hence, the example in FIG. 1 may be an example that depicts two decks of memory array.

In some cases, memory cells 105 are configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with paraelectric or linear polarization properties as the insulator. By contrast, a ferroelectric memory cell may include a capacitor with a ferroelectric material as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing, which may be referred to as access operations, may be performed on memory cells 105 by activating or selecting word line 110 and digit line 115. Word lines 110 may also be known as row lines, sense lines, and access lines. Digit lines 115 may also be known as bit lines, column lines, access lines. References to word lines and digit lines, or their analogues, are interchangeable without loss of understanding or operation. Word lines 110 and digit lines 115 may be perpendicular (or nearly perpendicular) to one another to create an array. Depending on the type of memory cell (e.g., FeRAM, RRAM), other access lines may be present (not shown), such as plate lines, for example. It should be appreciated that the exact operation of the memory device may be altered based on the type of memory cell and/or the specific access lines used in the memory device.

Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W)), metal alloys, carbon, conductively-doped semiconductors, or other conductive materials, alloys, compounds, or the like.

Memory array 100 may be a two-dimensional (2D) memory array or a three-dimensional (3D) memory array. A 3D memory array may include two-dimensional (2D) memory arrays formed on top of one another. This may increase the number of memory cells that may be placed or created on a single die or substrate as compared with 2D arrays, which in turn may reduce production costs or increase the performance of the memory array, or both. Memory array 100 may include any number of levels. Each level may be aligned or positioned so that memory cells 105 may be approximately aligned with one another across each level. Each row of memory cells 105 may be connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selector device. The word line 110 may be connected to and may control the selector device. For example, the selector device may be a transistor (e.g., thin-film transistor (TFT)) and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. In addition, as described below in FIG. 2, access operation of ferroelectric memory cells may need an additional connection to a node of the ferroelectric memory cell, namely cell plate node via plate line. In some embodiments, a selected digit line 115 may be precharged to a first voltage while a word line 110 is activated to couple a memory cell 105 to the digit line 115 during an access operation (e.g., a read operation). Further, an amount of charge may be determined using another digit line 115 that is not coupled with a memory cell (e.g., a reference digit line) during the precharge. As a current corresponding to the amount of charge may be used to precharge the selected digit line, the word line 110 may remain activated during the access operation to avoid a transient time delay associated with discharging and charging the word line 110.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed. In addition, access operation of ferroelectric memory cells may need to activate a corresponding plate line for the memory cell 105, associated with plate line decoder (not shown).

In some embodiments, an additional digit line 115 (e.g., a reference digit line) may be precharged while a selected digit line 115 (e.g., a target digit line) is coupled to a memory cell 105 to read. A precharge circuit may supply an amount of charge to both the additional digit line and the selected digit line based on a current mirroring scheme. The additional digit line may be unassociated with a memory cell 105 and may be from an unselected portion of the memory array 100. In some cases, the reference digit line may be located in an inactive memory tile, memory section, or the like. In some embodiments, the additional digit line may belong to an unselected upper deck when a memory cell in a lower deck is accessed using the precharging period.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

In some embodiments, the sense component 125 may include a capacitor configured to precharge to variable voltage levels. The voltage levels may be different depending on various phases of an access operation (e.g., a read operation, a self-reference operation). The capacitor may be connected to a selected digit line 115 that is coupled to a memory cell 105 to supply an additional amount of charge to the selected digit line 115. The additional amount of charge may correspond to a logic state of the memory cell 105. The memory cell 105 may store a logic value to read (e.g., a logic state of 1 or 0) or a known logic value to provide a reference for the read operation. Thus, the capacitor may detect a signal from the memory cell 105 during the read operation or a reference signal during the self-reference operation.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

In some memory architectures, including DRAM, memory cells may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105.

In some embodiments, the memory controller 140 may control various phases of a read operation and/or a self-reference operation. In some cases, the memory controller 140 may control various timings associated with coupling a selected digit line 115 with another digit line 115 (e.g., a reference digit line) based on activating a word line 110 to couple a memory cell 105 with the selected digit line 115. In other cases, the memory controller 140 may control a precharge circuit that is configured to supply an amount of charge to the digit lines coupled with each other and monitor a status of precharging (e.g., a voltage of the reference digit line) to determine whether the precharging is complete. In some cases, the memory controller 140 may control various timings associated with precharging a capacitor that is configured to detect a logic state of the memory cell 105 such as coupling the capacitor to a voltage supply node, dissociating the selected digit line 115 from the reference digit line 115, coupling the charged capacitor to the selected digit line, or the like.

In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during an access (or write or program) operation in which all memory cells 105, or a group of memory cells 105, are set or reset to a single logic state. It should be appreciated that the exact operation of the memory device may be altered based on the type of memory cell and/or the specific access lines used in the memory device. In some examples where other access lines e.g., plate lines, may be present (not shown), a corresponding plate line in collaboration with a word line and a digit line may need to be activated to access a certain memory cell 105 of the memory array. It should be appreciated that the exact operation of the memory device may vary based on the type of memory cell and/or the specific access lines used in the memory device.

Figure 2:
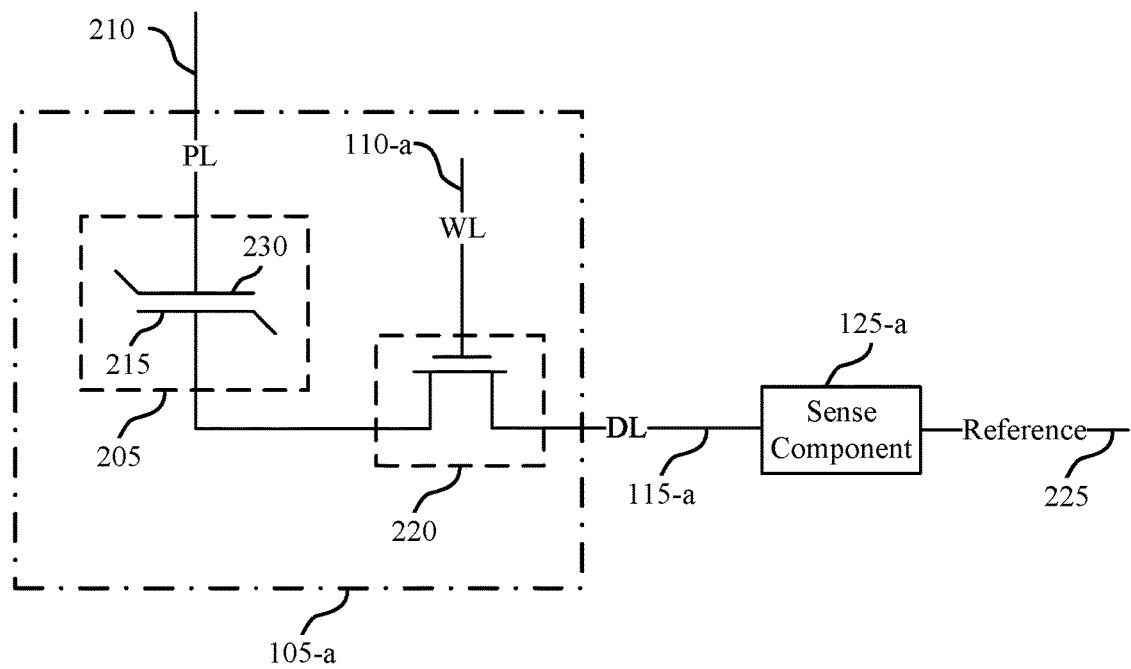
FIG. 2 illustrates an example of a circuit that supports techniques for precharging a memory cell in accordance with embodiments of the present disclosure.

FIG. 2 illustrates an exemplary diagram 200 of a ferroelectric memory cell and circuit components that supports techniques for precharging a memory cell accordance with embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selector device 220 and reference line 225. Cell plate 230 may be accessed via plate line 210 and cell bottom 215 may be accessed via digit line 115-a. As described above, various states may be stored by charging or discharging the capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selector device 220 is deactivated, and capacitor 205 can be connected to digit line 115-a when selector device 220 is activated. Activating selector device 220 may be referred to as selecting memory cell 105-a. In some cases, selector device 220 is a transistor (e.g., thin-film transistor (TFT)) and its operation is controlled by applying a voltage to the transistor gate, where the voltage magnitude is greater than the threshold voltage magnitude of the transistor. Word line 110-a may activate the selector device 220; for example, a voltage applied to word line 110-a is applied to the transistor gate, connecting the capacitor 205 with digit line 115-a.

In some embodiments, the word line 110-a may remain activated during various phases of an access operation to avoid a transient delay associated with discharging and charging the word line 110-a. Further, the word line 110-a may remain activated during various phases of a self-reference operation that may follow the read operation. In some embodiments, a precharge circuit may be used to supply a controlled amount of current to a digit line 115-a that is coupled with a memory cell 105-a such that the word line 110-a may remain activated during the access operation.

In other examples, the positions of selector device 220 and capacitor 205 may be switched, such that selector device 220 is connected between plate line 210 and cell plate 230 and such that capacitor 205 is between digit line 115-a and the other terminal of selector device 220. In this embodiment, selector device 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing the plate line 210 and word line 110-a. Biasing the plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage may depend on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 225, which may be a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

In some embodiments, a precharge circuit may supply a controlled amount of current to a first digit line 115-*a* that is coupled with a memory cell 105-*a* (e.g., a target digit line) while a word line 110-*a* associated with the memory cell 105-*a* is active (e.g., selected). The first digit line 115-*a* may be precharged to a first voltage when supplied with the controlled amount of current. The controlled amount of current may be determined to precharge the intrinsic capacitance of a second digit line 115-*a* (e.g., an unloaded digit line without having a memory cell 105 coupled with it, a reference digit line) such that the second digit line 115-*a* may precharge to a second voltage when supplied with the controlled amount of current. The first voltage may be less than the second voltage due to an additional capacitive load of the first digit line 115-*a* associated with the memory cell 105-*a*. The voltage difference between the first voltage and the second voltage may be attributed to a logic state of the memory cell 105-*a*. Further, the voltage difference may depend on the logic state of the memory cell 105-*a*.

In some embodiments, a precharged capacitor in the sense component 125-*a* may be coupled with the first digit line 115-*a* based on the first digit line 115-*a* precharged to the first voltage. The precharged capacitor may detect the voltage difference by supplying an additional amount of charge to further raise the voltage of the first digit line 115-*a* to the second voltage. The voltage difference may be stored in the sense component 125-*a* as a signal from the memory cell 105-*a* representing the logic state of the memory cell 105-*a*. In some embodiments, the memory cell 105-*a* may be reset based on storing the signal in the sense component 125-*a* to generate a self-reference signal. In some cases, resetting the memory cell may result in a known logic state (e.g., a logic state of 1) stored at the memory cell 105-*a*. The self-reference signal may be generated by using the same first digit line, second digit line, and the memory cell 105-*a* repeating the precharge steps using the precharge circuit providing the controlled amount of current. Subsequently, the sense component 125-*a* may store the self-reference signal to compare with the signal representing the logic state of the memory cell 105-*a*.

To write memory cell 105-*a*, a voltage may be applied across capacitor 205. Various methods may be used. In one example, selector device 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

Figure 3:
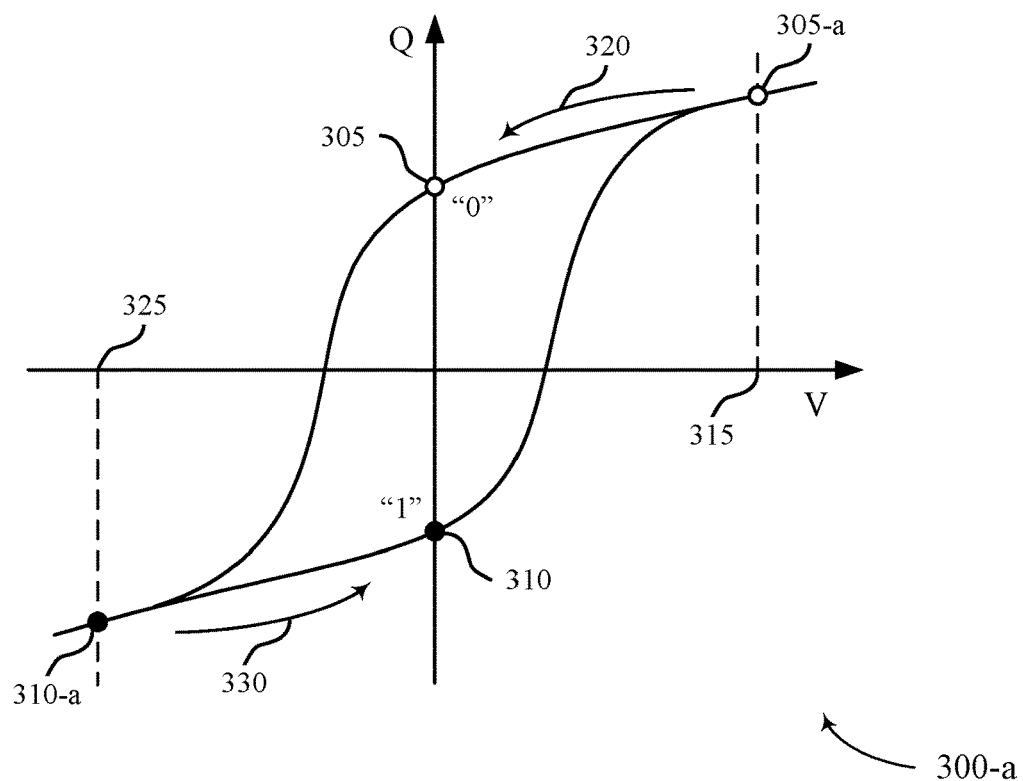
FIG. 3 illustrates an example of hysteresis curves that support techniques for precharging a memory cell in accordance with embodiments of the present disclosure.
Figure 3:
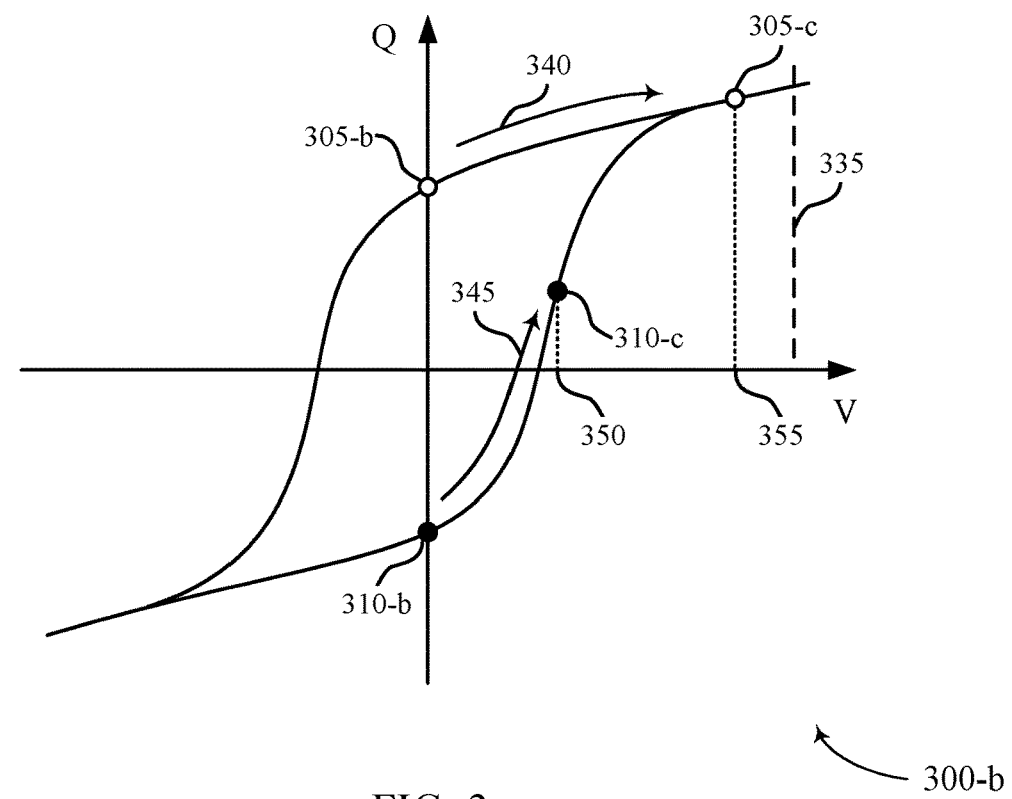

FIG. 3 illustrates an example of non-linear electrical properties with hysteresis curves 300-*a* and 300-*b* for a ferroelectric memory cell that supports techniques for precharging a memory cell in accordance with embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not be equal to voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

In some embodiments, a self-reference operation may follow a read operation. During the self-reference operation, a reference signal may be generated by using the same first digit line, the second digit line, and the memory cell that have been used to generate and store a signal representing a logic state of the memory cell during the read operation. Further, the same precharge circuit may be used to repeat similar precharge steps performed during the read operation. In some embodiments, a word line associated with the memory cell may remain active (e.g., selected) during the read operation or the self-reference operation. In some embodiments, a word line associated with the memory cell may remain active (e.g., selected) during the read and the self-reference operations.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction.

Figure 4:
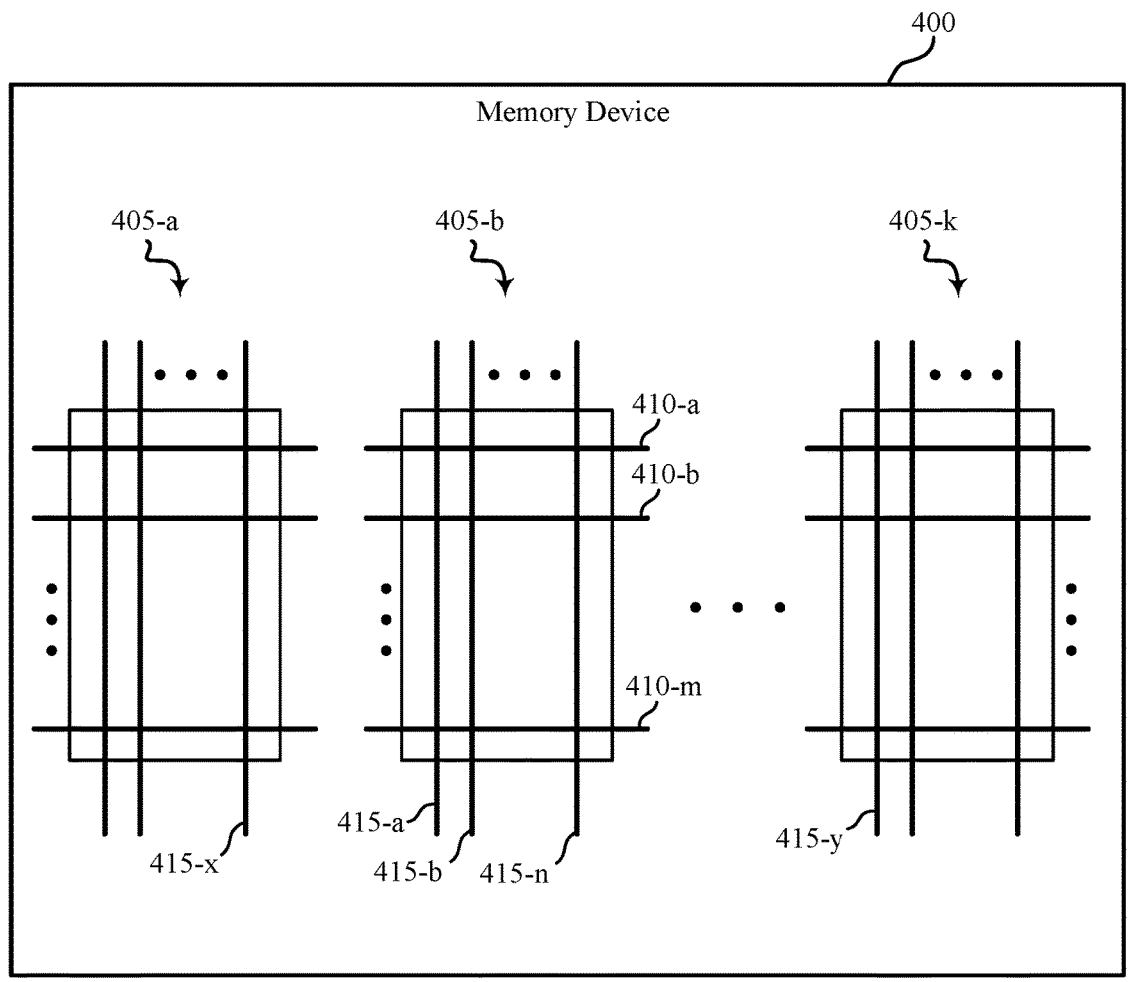
FIG. 4 illustrates an example of a memory device that supports techniques for precharging a memory cell in accordance with embodiments of the present disclosure.

FIG. 4 illustrates an example of a memory device 400 that supports techniques for precharging a memory cell in accordance with embodiments of the present disclosure. The memory device 400 may be an example of the memory device 100 described with reference to FIG. 1. The memory device 400 illustrates that a reference digit line may be a digit line associated with a different portion of memory array that is inactive during an access operation. The memory device 400 may precharge the reference digit line to a given voltage value without a contribution from a memory cell associated with the reference digit line during the access operation. Further, the memory device 400 may monitor a voltage of the reference digit line to determine whether the precharging is complete. The memory device 400 may include a plurality of memory arrays 405. The memory array 405 may be a section of memory cells that are accessed during an access operation of a single memory cell in the array. Each memory array (e.g., 405-*a*, 405-*b*, or 405-*k*) may include a set of word lines 410 and a set of digit lines 415 that are configured to couple with a memory cell (e.g., a memory cell 105 described with reference to FIGS. 1 and 2) at each cross section of a word line (e.g., a word line 410-*a*) and a digit line (e.g., a digit line 415-*a*). As FIG. 4 illustrates a top-down view of a portion of a memory device, it only illustrates overall layout of memory arrays and a few access lines (e.g., word lines and digit lines) associated with each memory array for clarity.

Each memory array 405 may have a similar configuration such that their repetitive arrangements construct the memory device 400 of a desired total capacity. In some embodiments, each memory array 405 may be placed in a same plane adjacent to each other. In other embodiments, each memory array 405 may be placed on top of another to construct a three-dimensional (3D) memory array structure (not shown). Each memory array 405 may be referred to as a memory tile, a memory section, or the like. The memory device 400 may include various components in the area unoccupied by the memory arrays 405, such as a precharge circuit as well as a row decoder 120, sense component 125, or a column decoder 130 as described with reference to FIG. 1.

The techniques for precharging a memory cell while coupled with a target digit line utilizes two digit lines, namely the target digit line (TDL) (sometimes referred to as a selected digit line) and a reference digit line (RDL). When the TDL is coupled with the memory cell, the precharge circuit may have an additional electrical load. The precharge circuit may be configured to provide a bias to an unloaded digit line (e.g., the RDL) to a predetermined precharge voltage. This additional electrical load of the memory cell may prevent the TDL from reaching the predetermined precharge voltage. In such scenarios, the voltage on the TDL may level off at some voltage less than the predetermined precharge voltage. To determine when the precharge circuit has completed its precharging, the memory device 400 may monitor the RDL that is also being precharged. The RDL may be any digit line that is unloaded during the access operation. As such, when the precharge circuit applies its charge, the RDL may be biased to the predetermined precharge voltage. Because every digit line in the array 405 that is associated with the selected memory cell is loaded (e.g., every digit line is associated with at least one active word line), the RDL may be a digit line found in a different array 405 (e.g., an unselected or inactivated array). In some cases, the RDL may be a dummy digit line.

By way of example, when a memory cell in the memory array 405-b is to be read, i.e., at least one of the word lines 410-a through 410-m is activated, none of the digit lines 415 in the memory array 405-b may be used as the RDL because all the digit lines 415-a through 415-n in the memory array 405-b are associated with at least one activated word line and therefore are coupled with an additional electrical load. Therefore, the RDL may need to be provided by a digit line that are not associated with the memory array 405-b being access during the access operation. For example, a digit line 415-x of the memory array 405-a or a digit line 415-y of the memory array 405-k may function as the RDL so long as none of memory cells of either the memory array 405-a or the memory array 405-k is activated. In some embodiments, an RDL may belong to an unselected upper deck when a memory cell in a lower deck is accessed using the precharging techniques.

Figure 5:
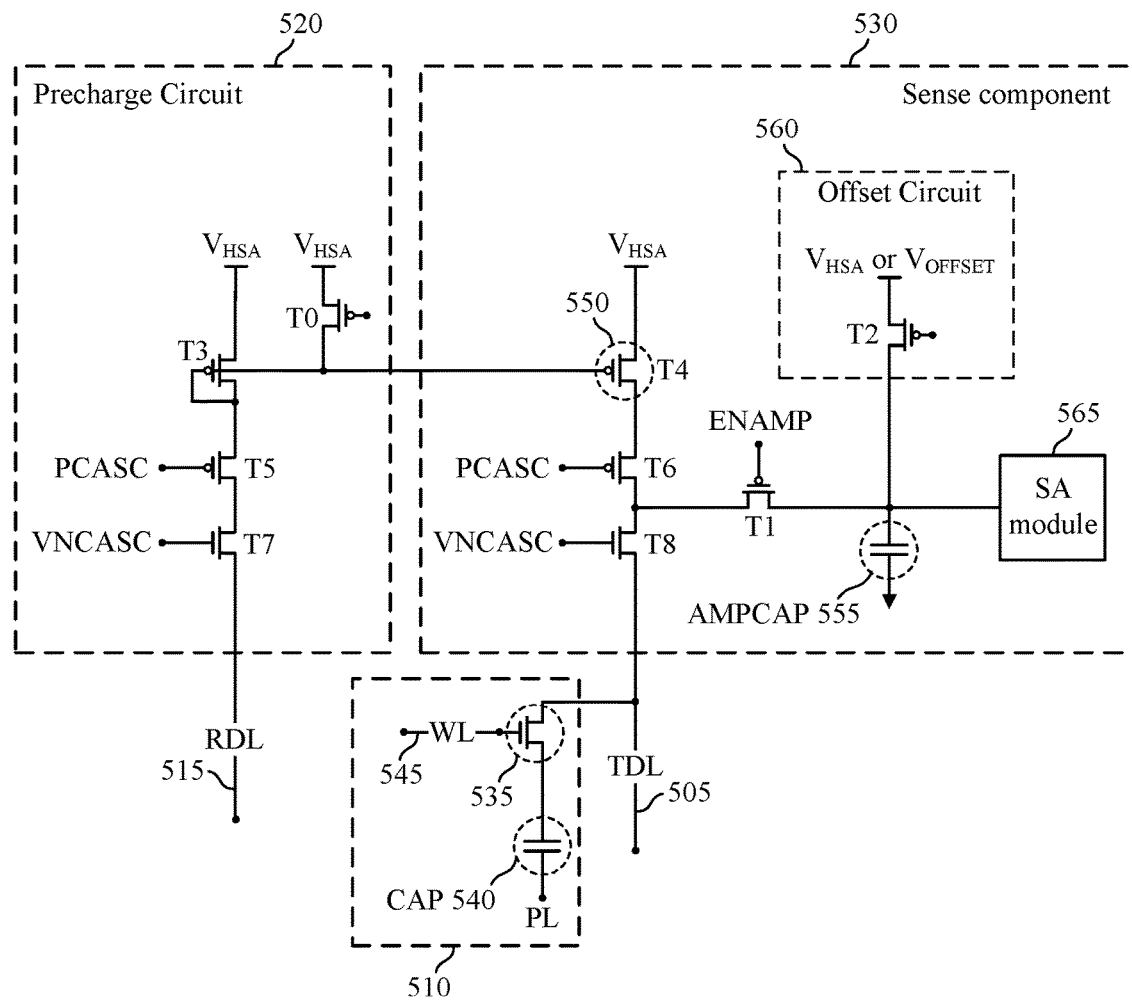
FIG. 5 illustrates an example of a circuit that supports techniques for precharging a memory cell in accordance with embodiments of the present disclosure.

FIG. 5 illustrates an example of a circuit 500 that supports techniques for precharging a memory cell in accordance with embodiments of the present disclosure. The circuit 500 illustrates a simplified circuit configuration to highlight several circuit components collaborating to enable the techniques for precharging a memory cell that provide a fast and reliable read operation. The circuit 500 includes a target digit line (TDL) 505, a memory cell 510, a reference digit line (RDL) 515, a precharge circuit 520, a sense component 530. The TDL 505 (e.g., a selected digit line, a first digit line) may be an example of the digit line 415-b described with reference to FIG. 4. The memory cell 510 may be an example of the memory cell 105 described with reference to FIGS. 1 and 2. The RDL 515 (e.g., an unloaded digit line, a second digit line) may be an example of the digit line 415-x or 415-y described with reference to FIG. 4. The sense component 530 may be an example of or some portion of the sense component 125 described with reference to FIGS. 1 and 2.

The memory cell 510 may include a selector device 535 and a capacitor 540. In some cases, the capacitor 540 may be an example of a ferroelectric capacitor. The selector device 535 may be an example of the selector device 220 described with reference to FIG. 2. the capacitor 540 may be an example of the capacitor 205 described with reference to FIG. 2. Further, the memory cell 510 may be associated with a word line (WL) 545. The WL 545 may be an example of the word line 110 described with reference to FIGS. 1 and 2 or one of word lines 410-a through 410-m described with reference to FIG. 4. In some cases, the capacitor 540 may be a FeRAM capacitor of the memory cell 105 described with reference to FIGS. 1 and 2. The capacitor 540 may store a logic state (e.g., a logic state of 1 or 0). During an access operation (e.g., a read operation to read the logic state stored at the capacitor 540), the WL 545 may be activated (e.g., selected) and the selector device 535 may couple the capacitor 540 with the TDL 505. In some embodiments, the WL 545 may remain activated during an access operation. In some embodiments, the WL 545 may remain activated during a read operation (e.g., reading a value from the memory cell 510) and a self-reference operation.

The precharge circuit 520 may include transistors T0, T3, T5, and T7. T0 may be configured to connect or disconnect a gate nodes of T3 to $V_{HSA}$ (a voltage supply node). T3 may be configured to provide an amount of charge to the RDL 515 when precharging the RDL 515. In some embodiments, precharging the RDL 515 may occur while the WL 545 is activated. In some embodiments, the RDL 515 may be coupled with a second word line that is inactive (e.g., a different word line than the WL 545). In some embodiments, the second word line may be associated with a portion of a memory device that is inactive during an access operation. T5 may be configured to be driven by a PCASC node to connect or disconnect the RDL 515 from T3 while T7 may be configured to be driven by a VNCASC node. In some embodiments, the PCASC and VNCASC nodes may be associated with a cascode regulation circuit (not shown) that may be configured to control a digit line voltage. The circuit configuration of transistors T0, T3, T5, and T7 when connected to the RDL 515 may be referred to as a first branch of a current mirror. In some embodiments, each memory array (e.g., memory arrays 405 described with reference to FIG. 4) may include a precharge circuit 520.

The sense component 530 may include transistors T1, T2, T6, T8, and T4 550. The sense component 530 may further include a capacitor (AMPCAP) 555 (e.g., a precharge capacitor), an offset circuit 560, and a sense amplifier (SA) module 565. In some embodiments, T4 550 may be configured to couple the TDL 505 with the RDL 515 during an access operation. Further, T4 550, when turned on by T0 (e.g., T0 driving gate nodes of T3 and T4), may be configured to mirror a current corresponding to the charge (e.g., the charge provided by T3 to the RDL 515 to precharge the RDL 515) to the TDL 505 that is coupled with the capacitor 540. When T4 550 is turned off, the TDL 505 that is coupled with the capacitor 540 may no longer receive the charge. In some embodiments, T4 550 may decouple the RDL 515 from the TDL 505 based on precharging the TDL 505. T6, similar to T5, may be configured to be driven by PCASC node to connect or disconnect the TDL 505 from T4 while T8, similar to T7, may be configured to be driven by VNCASC node. In some embodiments, PCASC and VNCASC nodes may be associated with a cascode regulation circuit (not shown) that may be configured to control a digit line voltage. In some embodiments, the AMPCAP 555 may be configured to precharge the TDL 505 to a predetermined voltage during a precharge operation based on the TDL 505 being coupled to the memory cell 510.

In some embodiments, T1 may be configured to be driven by a node ENAMP to connect or disconnect the AMPCAP 555 to the TDL 505. In some embodiments, T1 may couple the AMPCAP 555 to the TDL 505 based on precharging the TDL 505 to a first voltage. In some embodiments, T1 may couple the AMPCAP 555 to the TDL 505 based on decoupling the RDL 515 from the TDL 505 to further precharge the TDL 505 to a second voltage that is greater than the first voltage. In some embodiments, T2 may be configured to connect the AMPCAP 555 to the offset circuit 560 to charge the AMPCAP 555 to either $V_{HSA}$ or $V_{OFFSET}$. The offset circuit 560, of which T2 is a part of, may be configured to connect the AMPCAP 555 to $V_{HSA}$ during a read operation and to $V_{OFFSET}$ during a self-reference operation. For example, the AMPCAP 555 may be precharged to $V_{HSA}$ during a read operation such that a voltage across the AMPCAP 555 at the completion of the read operation may correspond to either a first voltage (e.g., 1 volt indicating a logic state of 0 stored at the capacitor 540) or a second voltage (e.g., 0.6 volts indicating a logic state of 1 stored at the capacitor 540). Further, the AMPCAP 555 may be precharged to $V_{OFFSET}$ during a self-reference operation such that a voltage across the AMPCAP 555 at the completion of the self-reference operation may correspond to a third voltage (e.g., 0.8 volts, a mid-point between the first voltage and the second voltage). Particular voltage values across the AMPCAP 555 during various phases of an access operation may depend on capacitance values of the TDL 505, the RDL 515, the capacitor 540, or the AMPCAP 555, among others. In some embodiments, the offset circuit 560 may be configured to provide a set of $V_{OFFSET}$ values based on an operating characteristic of the memory cell 510.

The SA module 565 may include a capacitor (not shown) configured for sampling and holding the voltage across the AMPCAP 555, a latch (not shown) with two nodes (e.g., MG node and RG node), and an ISO device (not shown). In some embodiments, the AMPCAP 555 may be configured to compensate for a voltage difference between the TDL 505 and the RDL 515 after precharging the TDL 505 to the first voltage such that the AMPCAP 555 may amplify a signal from the memory cell 510 during a read operation. In some embodiments, the voltage across the AMPCAP 555 representing a logic state stored at the capacitor 540 may be stored at the MG node of the latch during a read operation. In some embodiments, the voltage across the AMPCAP 555 representing a reference signal may be stored at the RG node of the latch during a self-reference operation. In some embodiments, the SA module 565 may be configured to detect a charge of the AMPCAP 555 after the TDL 505 has been charged to the second voltage such that the SA module 565 may identify a logic state stored at the capacitor 540. In some embodiments, the SA module 565 may be configured to use the reference signal from the AMPCAP 555 to distinguish whether a charge stored on the memory cell 510 corresponds to a first logic state or a second logic state.

Detail operations of the circuit 500 that supports techniques for precharging a memory cell is further illustrated as described with reference to FIG. 6.

Figure 6:
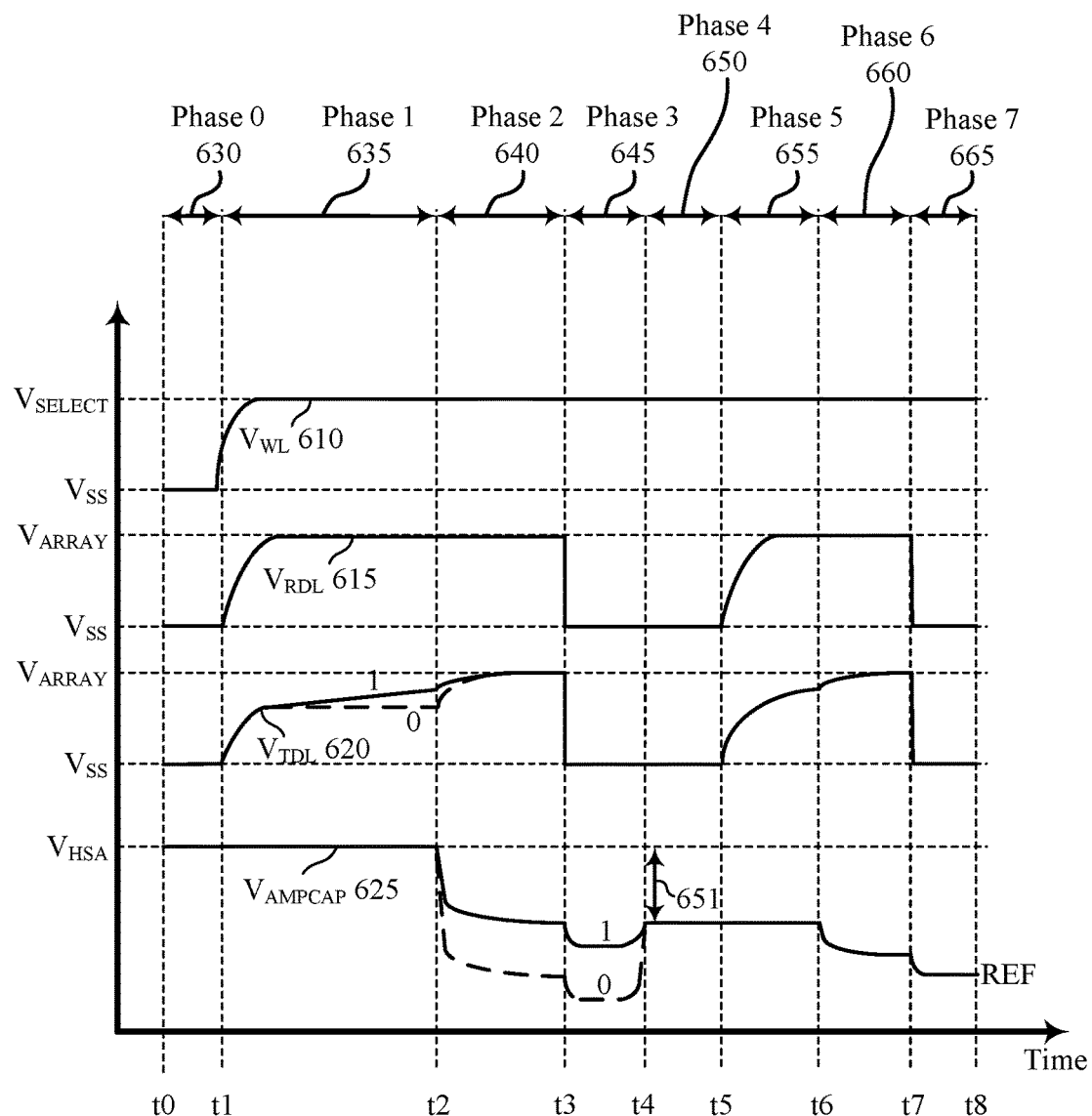
FIG. 6 illustrates an example of a timing diagram that supports techniques for precharging a memory cell in accordance with embodiments of the present disclosure.

FIG. 6 illustrates an example of a timing diagram 600 that supports techniques for precharging a memory cell in accordance with embodiments of the present disclosure. The timing diagram 600 illustrates procedures during a read operation and a self-reference operation. The read operation may correspond to a time period between t1 and t4 that includes a first phase 635 through a third phase 645. The self-reference operation may correspond to a time period between t4 and t8 that includes a fourth phase 650 through a seventh phase 665. The timing diagram 600 shows various voltage levels associated with the components of the circuit 500 described with reference to FIG. 5 to illustrate how the techniques for precharging a memory cell provide a fast and reliable read operation. The timing diagram 600 includes a voltage applied to the WL 545 of the memory cell 510 (i.e., $V_{WL}$ 610), a voltage of the RDL 515 (i.e., $V_{RDL}$ 615), a voltage of the TDL 505 (i.e., $V_{TDL}$ 620), a voltage across the AMPCAP 555 (i.e., $V_{AMPCAP}$ 625).

During the initial phase 630, which may also be referred to as an idle period, both the RDL 515 and the TDL 505 are kept at ground (or a virtual ground). Thus, the $V_{RDL}$ 615 and the $V_{TDL}$ 620 may be at Vss. The AMPCAP 555 may be precharged to $V_{HSA}$ (e.g., through T2) while isolated from the TDL 505 (e.g., T1 turned off). Thus, the $V_{AMPCAP}$ 625 may be at $V_{HSA}$. The WL 545 may be unselected during the idle period. Thus, the $V_{WL}$ 610 may be at Vss. Further, the memory cell 510 is dissociated from the TDL 505 as the WL 545 is unselected.

At time t1, the first phase 635, which may also be referred to as a precharge period, may begin. The $V_{WL}$ 610 may be raised to Vselect to read a logic state stored at the capacitor 540 of the memory cell 510. As a result, the capacitor 540 couples with the TDL 505. Further, the $V_{RDL}$ 615 may increase as T3 starts to provide an amount of charge to precharge the RDL 515 to $V_{ARRAY}$. In some cases, a voltage level of $V_{ARRAY}$ is a different than a voltage level of $V_{HSA}$. For example, $V_{ARRAY}$ may be less than $V_{HSA}$ in part because switching components T7 and T8 may limit a voltage dynamic of the TDL 505 and the RDL 515. Both T5 and T7 may be turned on to enable the precharging of the RDL 515. In some instances, the amount of charge to precharge the RDL 515 may be referred to as a RDL charge. The RDL charge may be expressed as $C_{RDL} \times V_{ARRAY}$ where $C_{RDL}$ represents a capacitance value of the RDL 515. In some cases, to precharge the TLD 505, the VNCASC signal may be biased with a voltage value. The voltage value may be $V_{ARRAY} + V_{TH}$, where $V_{TH}$ is a threshold voltage for transistor VNCASC (e.g., an nmos threshold). Additionally, the $V_{TDL}$ 620 may start to increase toward $V_{ARRAY}$ as T4 turns on to supply the same amount of charge (e.g., the RDL charge) to the TDL 505 (coupled with the capacitor 540). Both T6 and T8 may be turned on to enable the precharging of the TDL 505. In some embodiments, the $V_{RDL}$ 615 may be monitored to end the first phase 635 when the precharging is complete.

It should be appreciated that a parallel configuration of the TDL 505 coupled with the capacitor 540 results in a larger capacitance load than that of the RDL 515 and therefore the RDL charge may not raise the $V_{TDL}$ 620 up to the $V_{ARRAY}$ level during the first phase 635. Further, depending on a logic state stored at the capacitor 540, the $V_{TDL}$ 620 may develop two voltage levels during the first phase 635. In some embodiments, a logic state of 0 stored at the capacitor 540 may produce a less $V_{TDL}$ value than a logic state of 1 stored at the capacitor 540 after receiving the RDL charge. Such a difference may be attributed to a dipole switching phenomenon associated with a ferroelectric material of the capacitor 540 when a logic state 0 is stored at the capacitor 540. FIG. 6 denotes the two different values of the $V_{TDL}$ 620, each associated with a logic 0 or a logic 1, in some embodiments. During the first phase 635, the $V_{AMPCAP}$ 625 may remain constant at $V_{HSA}$ because T1 is off to isolate the AMPCAP 555 from the TDL 505.

At time t2, the second phase 640, which may also be referred to as a signal developing period, may begin. T5 and T6 may turn off to disconnect the RDL 515 and the TDL 505 from further charging. Subsequently, T1 may turn on to connect the AMPCAP 555 (which has been precharged to $V_{HSA}$) to the TDL 505 (coupled with the capacitor 540). The AMPCAP 555, may provide an additional amount of charge to the TDL 505 to bring the $V_{TDL}$ 620 close to $V_{ARRAY}$. Since the TDL 505 (coupled with the capacitor 540) has been already precharged by receiving the RDL charge during the first phase 635, the additional amount of charge provided by the AMPCAP 555 may correspond to the charge required by the capacitor 540 to bring the $V_{TDL}$ 620 close to $V_{ARRAY}$. As described above, depending on a logic state stored at the capacitor 540, the charge required by the capacitor 540 (which may be supplied by the AMPCAP 555) may be different. In some embodiments, a logic state of 0 stored at the capacitor 540 may require more amount of charge from the AMPCAP 555 to bring the $V_{TDL}$ 620 close to $V_{ARRAY}$ than a logic state of 1 stored at the capacitor 540. While providing the additional amount of charge to the TDL 505 (coupled with the capacitor 540), the $V_{AMPCAP}$ 625 may decrease. Depending on the logic state stored at the capacitor 540, the decrease in the $V_{AMPCAP}$ 625 may be different, thus a signal representing a logic state of the capacitor 540 is established as a voltage level of the $V_{AMPCAP}$ 625 during the second phase 640. In some embodiments, a logic state of 0 stored at the capacitor 540 may result in more reduction in the $V_{AMPCAP}$ 625 when compared to a logic state of 1 stored at the capacitor 540.

At time t3, the third phase 645, which may be referred to as a signal capturing period, may begin. T1 may be turned off to isolate the AMPCAP 555 from the TDL 505. The $V_{AMPCAP}$ 625, which may have one of two different values representing the logic state stored at the capacitor 540, may be captured at a first node (e.g., MG node of the latch) of the SA module 565 of the sense component 530. FIG. 6 denotes the two different levels of $V_{AMPCAP}$ 625, each associated with a logic 0 or a logic 1, stored at the first node of the SA module 565. In some embodiments, the voltage difference between the two levels may be in the order of 350 mV. Further, both the RDL 515 and the TDL 505 may be reset to bring the $V_{RDL}$ 615 and the $V_{TDL}$ 620 to Vss. The capacitor 540 may be reset during the third phase 645. In some embodiments, resetting the capacitor 540 may result in a logic state of 1 stored at the capacitor 540.

At time t4, the fourth phase 650, which may be referred to as a self-reference preparation period, may begin. The AMPCAP 555 may be charged to $V_{OFFSET}$ by the offset circuit 560. The offset circuit 560 may be configured to connect the AMPCAP 555 to $V_{OFFSET}$ by turning on T2 coupled to $V_{OFFSET}$. The SA module 565 may be dissociated from the AMPCAP 555 while the AMPCAP 555 is being charged to $V_{OFFSET}$. The AMPCAP 555 is charged to $V_{OFFSET}$ in order to provide an offset between a reference signal to be generated during the self-reference operation using the capacitor 540. As the capacitor 540 has been reset during the third phase 645 (e.g., equivalent to storing a logic state of 1 in some embodiments), the AMPCAP 555 needs to be precharged to a voltage different than $V_{HSA}$ (e.g., $V_{OFFSET}$) to produce a reference signal that may be used to distinguish the signal from the capacitor 540 captured at the MG node of the SA module 565 during the third phase 645. A value of $V_{OFFSET}$ may be determined such that the reference signal produced during the self-reference operation to be placed in between the signals representing a logic state of 1 and a logic state of 0. For example, FIG. 6 denotes a value of $V_{AMPCAP}$ 625 with an offset corresponding to a voltage value 651. In some embodiments, the value of $V_{OFFSET}$ may be varied to account for variable electrical characteristics of aging of the capacitor 540 (e.g., due to cycling events, fatigue, imprint, or a combination thereof).

At time t5, the fifth phase 655, which may be referred to as a self-reference precharge period, may begin. During the fifth phase 655, operations (e.g., similar to the operations occurred during the first phase 635 may repeat to precharge the RDL 515 and the TDL 505 (coupled with the capacitor 540) to $V_{ARRAY}$. As described above, the $V_{TDL}$ 620 may not reach to $V_{ARRAY}$ due to the capacitor 540 coupled therewith. As the capacitor 540 has been reset during the third phase 645, the TDL 505 precharging may be similar to precharging of the TDL 505 with the capacitor 540 having a logic state of 1, in some embodiments.

At time t6, the sixth phase 660, which may also be referred to as a self-reference signal developing period, may begin. During the sixth phase 660, operations similar to the operations of the second phase 640 may repeat to provide an additional amount of charge to the capacitor 540 (which has been reset during the third phase 645) from the AMPCAP 555 that has been precharged to $V_{OFFSET}$. The additional amount of charge from the AMPCAP 555 may raise the $V_{TDL}$ 620 further. While supplying the additional amount of charge to the TDL 505 (couple to the capacitor 540), the $V_{AMPCAP}$ 625 may decrease. Since the AMPCAP 555 is precharged to $V_{OFFSET}$, the $V_{AMPCAP}$ 625 that develops during the sixth phase 660 may be different than the $V_{AMPCAP}$ 625 values that have been established during the second phase 640. A value of $V_{OFFSET}$ may be determined to place the $V_{AMPCAP}$ 625 during the sixth phase 660 (e.g., a reference voltage) to be in between the values of $V_{AMPCAP}$ 625 that have been established during the second phase 640 (e.g., a signal voltage).

At time t7, the seventh phase 665, which may be referred to as a self-reference signal capturing period, may begin. During the seventh phase 665, operations similar to the operations of the phase 3 may repeat to disconnect the AMPCAP 555 from the TDL 505 (coupled with the capacitor 540). The $V_{AMPCAP}$ 625 that has developed during the sixth phase 660, which may function as a reference voltage, may be captured by the SA module 565 during the seventh phase 665. In some embodiments, the $V_{AMPCAP}$ 625 representing the reference voltage may be stored at the second node (e.g., RG node of the latch) of the SA module 565. FIG. 6 denotes the $V_{AMPCAP}$ 625 at the end of the duration 7 665 (e.g., the reference voltage) as REF, which is in between the $V_{AMPCAP}$ 625 values that has been established during the third phase 645. At the completion of the seventh phase 665, the SA module 565 may determine the logic state of the capacitor 540 by comparing the signal captured at the MG node of the latch during the third phase 645 and the reference signal captured at the RG node of the latch during the seventh phase 665.

As described above, the capacitor 540 may be read using the RDL 515, the TDL 505, and the capacitor 540 to capture a signal therefrom at a first node of the SA module 565 during the phases 1 635 through the third phase 645 (e.g., the read operation). Additionally, a reference signal may be generated using the same RDL 515, TDL 505, and capacitor 540 to capture the reference signal at a second node of the SA module 565 during the fourth phase 650 through the seventh phase 665 (e.g., the self-reference operation). In some embodiments, the time duration between t1 (e.g., beginning of the phases 1 635) through t8 (e.g., ending of the seventh phase 665) may be approximately 50 ns. Additionally, the read operation may be performed independent of the self-reference operation, in some embodiments.

It should be appreciated that the WL 545 is activated at time t1 (the beginning of the first phase 635) and remains activated until the end of the seventh phase 665. In other words, no toggling of the WL 545 may be necessary throughout the read operation and the self-reference operation. The circuit configuration described with reference to FIG. 5 (e.g., T4 providing the same amount of charge, namely the RDL charge to precharge the RDL 515 to a given voltage, to the TDL 505 that is coupled with the capacitor 540) enables the WL 545 to remain activated, which may be referred to as a current mirroring scheme. Additionally, T6 (which is controlled by the PCASC node) is configured to connect or disconnect the current mirroring to the TDL 505 (coupled with the capacitor 540) depending on various phases of the read operation and the self-reference operation. Further, the configuration of the offset circuit 560 for precharging the AMPCAP 555 through T2 provides a flexibility to capture a logic state of the capacitor 540 when precharged to $V_{HSA}$ or to capture a reference signal when precharged to $V_{OFFSET}$.

Figure 7:
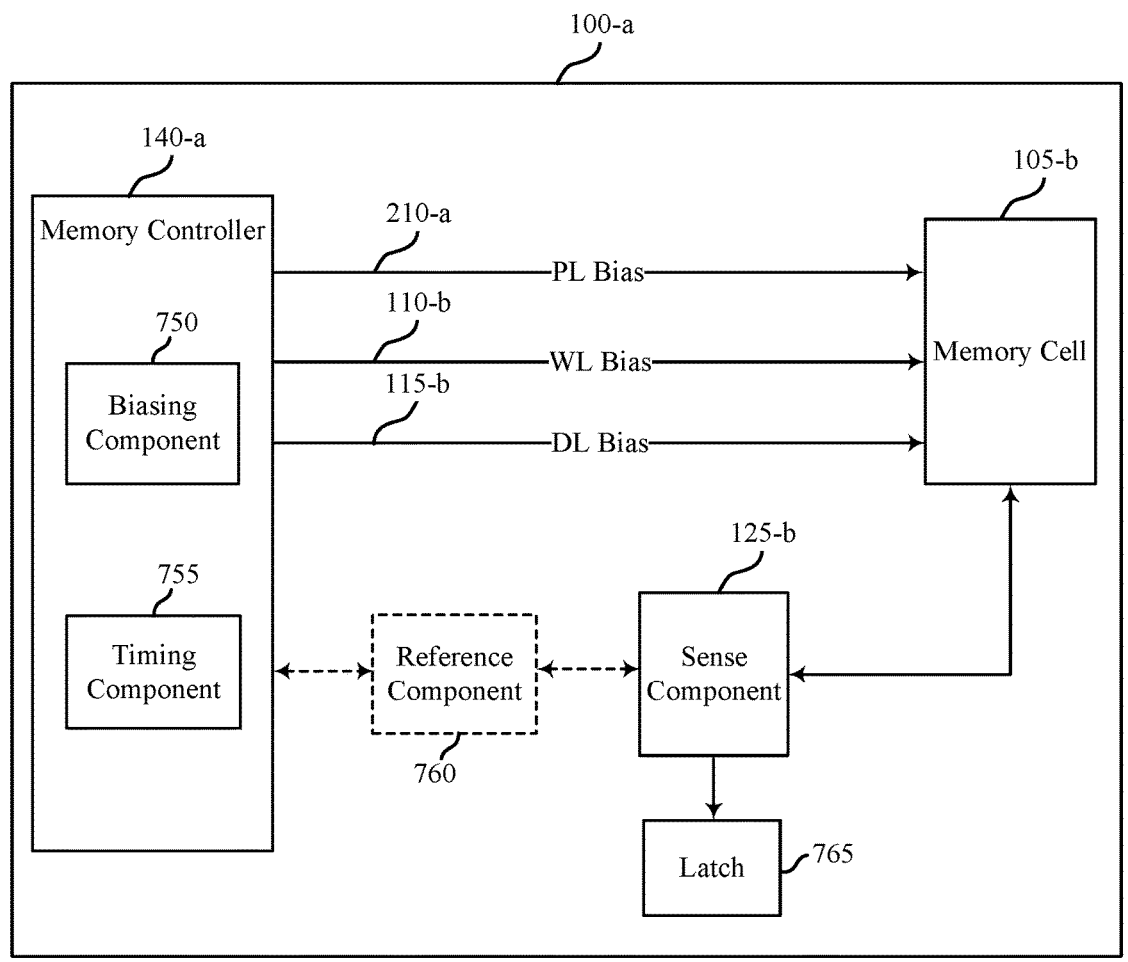
FIGS. 7 through 8 show block diagrams of a device that supports techniques for precharging a memory cell in accordance with embodiments of the present disclosure.

FIG. 7 shows a block diagram 700 of a memory device that supports techniques for precharging a memory cell in accordance with embodiments of the present disclosure. Memory array 100-*a* may be referred to as an electronic memory apparatus and includes memory controller 140-*a* and memory cell 105-*b*, which may be examples of memory controller 140 and memory cell 105 described with reference to FIG. 1. Memory controller 140-*a* may include a biasing component 750 and a timing component 755, and may operate memory array 100-*a* as described with reference to FIG. 1. Memory controller 140-*a* may be in electronic communication with word line 110-*b*, digit line 115-*b*, plate line 210-*a*, and sense component 125-*b*, which may be examples of word line 110, digit line 115, plate line 210, and sense component 125 described with reference to FIGS. 1 and 2. Memory array 100-*a* may also include a reference component 760 and a latch 765. The components of memory array 100-*a* may be in electronic communication with each other and may perform the functions described with reference to FIGS. 1 through 3. In some cases, the reference component 760, the sense component 125-*b*, and the latch 765 may be components of memory controller 140-*a*.

Memory controller 140-*a* may be configured to activate word line 110-*b*, plate line 210-*a*, or digit line 115-*b* by applying voltages to those various nodes. For example, the biasing component 750 may be configured to apply a voltage to operate memory cell 105-*b* to read or write memory cell 105-*b* as described above. In some cases, memory controller 140-*a* may include a row decoder, column decoder, or both, as described with reference to FIG. 1. This may enable the memory controller 140-*a* to access one or more memory cells 105. The biasing component 750 may also provide voltage potentials to the reference component 760 in order to generate a reference signal for sense component 125-*b*. Additionally, the biasing component 750 may provide voltage potentials for the operation of the sense component 125-*b*. In some embodiments, the memory controller 140-*a* may control various phases of a read operation and/or a self-reference operation. In some cases, the memory controller 140-*a* may activate a word line 110-*b* for a period to couple a memory cell 105-*b* to a digit line 115-*b* and precharge the digit line 115-*b* to a given voltage using an amount of charge during a portion of the period that the word line 110-*b* is activated. In some cases, the memory controller 140-*a* may read a value from a memory cell 105-*a* that is coupled with an activated word line 110-*b*, perform a self-reference operation using the memory cell 105-*a* to generate a reference voltage after reading the value from the memory cell 105-*a*, and keep the word line 110-*b* activated between reading the value from the memory cell 105-*a* and performing the self-reference operation.

In some cases, the memory controller 140-*a* may perform its operations using the timing component 755. For example, the timing component 755 may control the timing of the various word line selections, digit line selections, or plate line biasing, including timing for switching and voltage application to perform the memory functions, such as reading and writing, discussed herein. In some cases, the timing component 755 may control the operations of the biasing component 750.

In some cases, the memory array 100-*a* may include the reference component 760. The reference component 760 may include various components to generate a reference signal for the sense component 125-*b*. The reference component 760 may include circuitry configured to produce reference signals. In some cases, the reference component 760 may include other ferroelectric memory cells 105. In some examples, the reference component 760 may be configured to output a voltage with a value between the two sense voltages, as described with reference to FIG. 3. Or the reference component 760 may be designed to output a virtual ground voltage (i.e., approximately 0V).

In some cases, the memory array 100-*a* may generate a reference signal using a self-reference operation performed using a memory cell 105-*b* after reading a value from the memory cell 105-*b*. In some cases, reading the value from the memory cell 105-*b* may include precharging a first digit line 115-*b* coupled with the memory cell 105-*b* to a first voltage using a capacitor. In some cases, performing the self-reference operation may include precharging the first digit line 115-*b* to a second voltage using the capacitor and an offset circuit configured to provide an offset to the first voltage.

The sense component 125-*b* may compare a signal from memory cell 105-*b* (through digit line 115-*b*) with a reference signal (either a self-reference signal or a reference signal from the reference component 760). Upon determining the logic state, the sense component may then store the output in the latch 765, where it may be used in accordance with the operations of an electronic device that memory array 100-*a* is a part. In some embodiments, the sense component 125-*b* may use a reference signal generated during a self-reference operation to compare the signal from the memory cell 105-*b*.

In some cases, the memory device, which may be referred to as an electronic memory device, may include a ferroelectric memory cell selected to be accessed during an access operation, a first digit line configured to couple the ferroelectric memory cell with a sense component during at least a portion of the access operation, and a precharge circuit that is configured to precharge the first digit line by supplying an amount of charge to the first digit line during a first portion of the access operation, wherein the ferroelectric memory cell is configured to be coupled with the first digit line during the first portion of the access operation.

In some embodiments, the memory device described above may also include a second digit line different from the first digit line, wherein the precharge circuit may be configured to precharge the second digit line with the amount of charge to a first voltage different from a second voltage on the first digit line during the first portion of the access operation. In some embodiments, the second digit line may be associated with a portion of a memory device that may be inactive during an access operation performed on the ferroelectric memory cell. In some embodiments, the memory device described above may also include a transistor configured to couple the first digit line with the second digit line during the first portion of the access operation.

In some embodiments, the memory device described above may include a capacitor configured to amplify a signal from the ferroelectric memory cell during a second portion of the access operation, wherein the capacitor may be configured to compensate for a voltage difference between the first digit line and a second digit line after having received the amount of charge during the first portion of the access operation. In some embodiments, the memory device described above may include an offset circuit configured to precharge a capacitor to a voltage during a third portion of the access operation, wherein the sense component may be configured to use a reference voltage generated using the capacitor to distinguish whether a charge stored on the ferroelectric memory cell corresponds to a first logic state or a second logic state.

In some embodiments, the memory device described above may include the capacitor, during a second portion of the access operation, may be configured to capture a signal from the ferroelectric memory cell based at least in part on the first digit line being precharged during the first portion of the access operation. Further, the capacitor, during a third portion of the access operation, may be configured to capture a reference signal from the ferroelectric memory cell based at least in part on the offset circuit providing an offset to the capacitor, wherein the sense component may be configured to use the reference signal to distinguish whether the signal from the ferroelectric memory cell captured during the second portion of the access operation corresponds to a first logic state or a second logic state.

Figure 8:
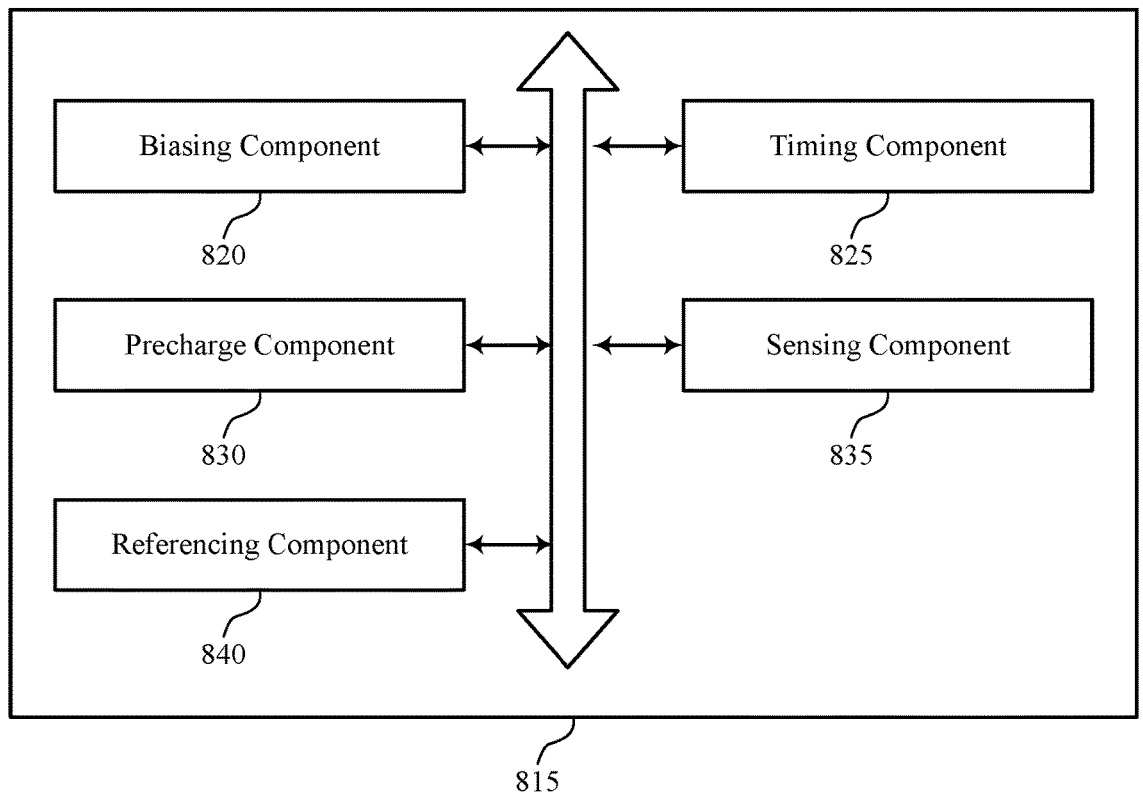

FIG. 8 shows a block diagram 800 of a memory controller 815 that supports techniques for precharging a memory cell in accordance with embodiments of the present disclosure. The memory controller 815 may be an example of aspects of the memory controller 140 described with reference to FIGS. 1 and 7. The memory controller 815 may include a biasing component 820, a timing component 825, a precharge component 830, a sensing component 835, and a referencing component 840. Each of these modules may communicate, directly or indirectly, with one another (e.g., via one or more buses).

The biasing component 820 may activate a first word line for a period to couple a ferroelectric memory cell with a first digit line and keep the word line activated between reading the value from the ferroelectric memory cell and performing the self-reference operation.

The precharge component 830 may precharge the first digit line to a first voltage using an amount of charge during at least a portion of the period that the first word line is activated and decouple the second digit line from the first digit line based on precharging the first digit line to the first voltage. In some embodiments, the precharge component 830 may couple a capacitor with the first digit line configured to precharge the first digit line to the second voltage based on decoupling the second digit line from the first digit line and precharge the first digit line to the second voltage by coupling the first digit line with a capacitor configured to precharge the first digit line to the second voltage associated with the second digit line based on precharging the first digit line to the first voltage.

In some embodiments, the precharge component 830 may couple a second digit line with the first digit line during at least the portion of the period that the first word line is activated based on activating the first word line, where precharging the first digit line is based on coupling the second digit line with the first digit line and precharge a second digit line to a second voltage higher than the first voltage using the amount of charge during at least the portion of the period that the first word line is activated, where the second digit line is coupled with the first digit line. In some embodiments, the precharge component 830 may read the value from the ferroelectric memory cell further includes precharging a first digit line coupled with the ferroelectric memory cell to a first voltage using a capacitor and perform the self-reference operation further includes precharging the first digit line to a second voltage using the capacitor and an offset circuit configured to provide an offset to the first voltage.

In some cases, the offset circuit is configured to provide a set offset values based on an operating characteristic of the ferroelectric memory cell. In some cases, the second digit line is coupled with a second word line that is inactive during an access operation performed on the ferroelectric memory cell. In some cases, the first array corresponds to a first group of ferroelectric memory cells in a first deck and the second array corresponds to a second group of ferroelectric memory cells in a second deck. In some cases, the second digit line is coupled with the first digit line using a transistor. In some cases, reading the value from the ferroelectric memory cell further includes: precharging a first digit line coupled with the ferroelectric memory cell using an amount of charge that is used to precharge a second digit line configured to couple with the first digit line. In some cases, the second digit line is associated with a portion of a memory device that is inactive during an access operation performed on the ferroelectric memory cell.

The sensing component 835 may detect a charge of a capacitor configured to precharge the first digit line from the first voltage to a second voltage, identify a logic state stored on the ferroelectric memory cell based on detecting the charge of the capacitor, and read a value from a ferroelectric memory cell that is coupled with an activated word line.

Referencing component 840 may perform a self-reference operation using the ferroelectric memory cell to generate a reference voltage after reading the value from the ferroelectric memory cell and generate the reference voltage using the ferroelectric memory cell after reading the value from the ferroelectric memory cell based on coupling the first digit line with the capacitor and the offset circuit.

In some cases, performing the self-reference operation further includes: precharging a first digit line coupled with the ferroelectric memory cell to a voltage associated with the reference voltage. In some cases, performing the self-reference operation further includes: coupling a first digit line connected with the ferroelectric memory cell with a capacitor configured to precharge the first digit line and with an offset circuit configured to provide an offset.

Figure 9:
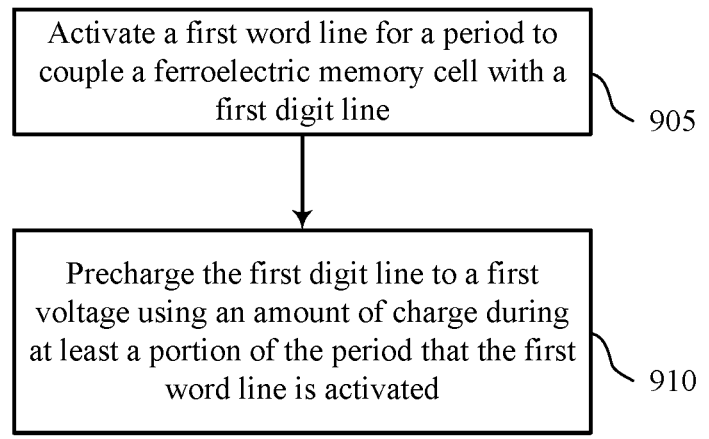
FIGS. 9 through 10 illustrate methods for techniques for precharging a memory cell in accordance with embodiments of the present disclosure.

FIG. 9 shows a flowchart illustrating a method 900 for techniques for precharging a memory cell in accordance with embodiments of the present disclosure. The operations of method 900 may be implemented by a memory array 100 or its components as described herein. For example, the operations of method 900 may be performed by a memory controller as described with reference to FIGS. 1, 7, and 8. In some examples, a memory array 100 may execute a set of codes to control the functional elements of the device to perform the functions described below. Additionally or alternatively, the memory array 100 may perform aspects of the functions described below using special-purpose hardware.

At 905 the memory array 100 may activate a first word line for a period to couple a ferroelectric memory cell with a first digit line. The operations of 905 may be performed according to the methods described herein. In certain examples, aspects of the operations of 905 may be performed by a biasing component as described with reference to FIGS. 7 and 8.

At 910 the memory array 100 may precharge the first digit line to a first voltage using an amount of charge during at least a portion of the period that the first word line is activated. The operations of 910 may be performed according to the methods described herein. In certain examples, aspects of the operations of 910 may be performed by a precharge component as described with reference to FIGS. 7 and 8.

An apparatus for performing the method 900 is described. The apparatus may include means for activating a first word line for a period to couple a ferroelectric memory cell with a first digit line and means for precharging the first digit line to a first voltage using an amount of charge during at least a portion of the period that the first word line is activated.

Another apparatus for performing the method 900 is described. The apparatus may include a memory cell and a memory controller in electronic communication with the memory cell, wherein the memory cell is operable to activate a first word line for a period to couple a ferroelectric memory cell with a first digit line and precharge the first digit line to a first voltage using an amount of charge during at least a portion of the period that the first word line is activated.

Some examples of the method 900 and apparatus described above may further include processes, features, means, or instructions for precharging a second digit line to a second voltage higher than the first voltage using the amount of charge during at least the portion of the period that the first word line may be activated, wherein the second digit line may be coupled with the first digit line. Some examples of the method 900 and apparatus described above may further include processes, features, means, or instructions for decoupling the second digit line from the first digit line based at least in part on precharging the first digit line to the first voltage.

Some examples of the method 900 and apparatus described above may further include processes, features, means, or instructions for coupling a capacitor with the first digit line configured to precharge the first digit line to the second voltage based at least in part on decoupling the second digit line from the first digit line. Some examples of the method 900 and apparatus described above may further include processes, features, means, or instructions for precharging the first digit line to the second voltage by coupling the first digit line with a capacitor configured to precharge the first digit line to the second voltage associated with the second digit line based at least in part on precharging the first digit line to the first voltage.

Some examples of the method 900 and apparatus described above may further include processes, features, means, or instructions for detecting a charge of a capacitor configured to precharge the first digit line from the first voltage to a second voltage. Some examples of the method 900 and apparatus described above may further include processes, features, means, or instructions for identifying a logic state stored on the ferroelectric memory cell based at least in part on detecting the charge of the capacitor. Some examples of the method 900 and apparatus described above may further include processes, features, means, or instructions for coupling a second digit line with the first digit line during at least the portion of the period that the first word line may be activated based at least in part on activating the first word line, wherein precharging the first digit line may be based at least in part on coupling the second digit line with the first digit line.

In some examples of the method 900 and apparatus described above, the second digit line may be coupled with a second word line that may be inactive during an access operation performed on the ferroelectric memory cell. In some examples of the method 900 and apparatus described above, the second digit line may be associated with a portion of a memory device that may be inactive during an access operation performed on the ferroelectric memory cell. In some examples of the method 900 and apparatus described above, the first array corresponds to a first group of ferroelectric memory cells in a first deck and the second array corresponds to a second group of ferroelectric memory cells in a second deck. In some examples of the method 900 and apparatus described above, the second digit line may be coupled with the first digit line using a transistor.

Figure 10:
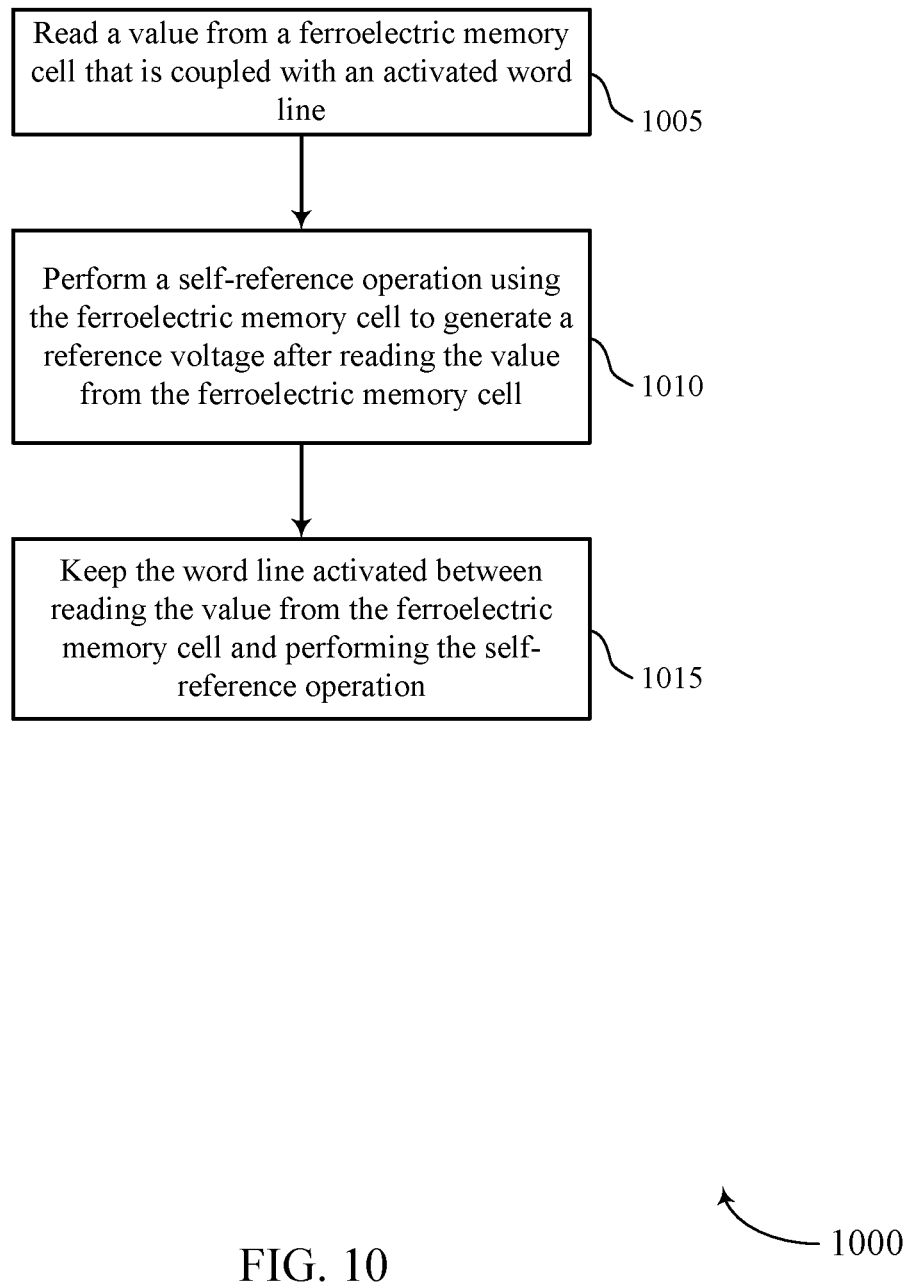

FIG. 10 shows a flowchart illustrating a method 1000 for techniques for precharging a memory cell in accordance with embodiments of the present disclosure. The operations of method 1000 may be implemented by a memory array 100 or its components as described herein. For example, the operations of method 1000 may be performed by a memory controller as described with reference to FIGS. 1, 7, and 8. In some examples, a memory array 100 may execute a set of codes to control the functional elements of the device to perform the functions described below. Additionally or alternatively, the memory array 100 may perform aspects of the functions described below using special-purpose hardware.

At 1005 the memory array 100 may read a value from a ferroelectric memory cell that is coupled with an activated word line. The operations of 1005 may be performed according to the methods described herein. In certain examples, aspects of the operations of 1005 may be performed by a sensing component as described with reference to FIGS. 7 and 8.

At 1010 the memory array 100 may perform a self-reference operation using the ferroelectric memory cell to generate a reference voltage after reading the value from the ferroelectric memory cell. The operations of 1010 may be performed according to the methods described herein. In certain examples, aspects of the operations of 1010 may be performed by a referencing component as described with reference to FIGS. 7 and 8.

At 1015 the memory array 100 may keep the word line activated between reading the value from the ferroelectric memory cell and performing the self-reference operation. The operations of 1015 may be performed according to the methods described herein. In certain examples, aspects of the operations of 1015 may be performed by a biasing component as described with reference to FIGS. 7 and 8.

An apparatus for performing the method 1000 is described. The apparatus may include means for reading a value from a ferroelectric memory cell that is coupled with an activated word line, means for performing a self-reference operation using the ferroelectric memory cell to generate a reference voltage after reading the value from the ferroelectric memory cell, and means for keeping the word line activated between reading the value from the ferroelectric memory cell and performing the self-reference operation.

Another apparatus for performing the method 1000 is described. The apparatus may include a memory cell and a memory controller in electronic communication with the memory cell, wherein the memory cell is operable to read a value from a ferroelectric memory cell that is coupled with an activated word line, perform a self-reference operation using the ferroelectric memory cell to generate a reference voltage after reading the value from the ferroelectric memory cell, and keep the word line activated between reading the value from the ferroelectric memory cell and performing the self-reference operation.

In some examples of the method 1000 and apparatus described above, performing the self-reference operation further comprises: precharging a first digit line coupled with the ferroelectric memory cell to a voltage associated with the reference voltage. In some examples of the method 1000 and apparatus described above, performing the self-reference operation further comprises: coupling a first digit line connected with the ferroelectric memory cell with a capacitor configured to precharge the first digit line and with an offset circuit configured to provide an offset. Some examples of the method 1000 and apparatus described above may further include processes, features, means, or instructions for generating the reference voltage using the ferroelectric memory cell after reading the value from the ferroelectric memory cell based at least in part on coupling the first digit line with the capacitor and the offset circuit.

In some examples of the method 1000 and apparatus described above, reading the value from the ferroelectric memory cell further comprises: precharging a first digit line coupled with the ferroelectric memory cell using an amount of charge that may be used to precharge a second digit line configured to couple with the first digit line.

Some examples of the method 1000 and apparatus described above may further include processes, features, means, or instructions for reading the value from the ferroelectric memory cell further comprises precharging a first digit line coupled with the ferroelectric memory cell to a first voltage using a capacitor. Some examples of the method 1000 and apparatus described above may further include processes, features, means, or instructions for performing the self-reference operation further comprises precharging the first digit line to a second voltage using the capacitor and an offset circuit configured to provide an offset to the first voltage. In some examples of the method 1000 and apparatus described above, the offset circuit may be configured to provide a plurality offset values based at least in part on an operating characteristic of the ferroelectric memory cell.

It should be noted that the methods described above describe possible implementations, and that the operations and the steps may be rearranged or otherwise modified and that other implementations are possible. Furthermore, features from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    activating a first word line for a period to couple a ferroelectric memory cell with a first digit line;
    precharging the first digit line to a first voltage using an amount of charge during at least a portion of the period that the first word line is activated; and
    precharging a second digit line to a second voltage higher than the first voltage using the amount of charge during at least the portion of the period that the first word line is activated, wherein the second digit line is coupled with the first digit line.

2. The method of claim 1, further comprising:
decoupling the second digit line from the first digit line based at least in part on precharging the first digit line to the first voltage.

3. The method of claim 2, further comprising:
coupling a capacitor with the first digit line configured to precharge the first digit line to the second voltage based at least in part on decoupling the second digit line from the first digit line.

4. The method of claim 1, further comprising:
precharging the first digit line to the second voltage by coupling the first digit line with a capacitor configured to precharge the first digit line to the second voltage associated with the second digit line based at least in part on precharging the first digit line to the first voltage.

5. The method of claim 1, further comprising:
detecting a charge of a capacitor configured to precharge the first digit line from the first voltage to the second voltage; and
identifying a logic state stored on the ferroelectric memory cell based at least in part on detecting the charge of the capacitor.

6. A method, comprising:
activating a first word line for a period to couple a ferroelectric memory cell with a first digit line;
precharging the first digit line to a first voltage using an amount of charge during at least a portion of the period that the first word line is activated; and
coupling a second digit line with the first digit line during at least the portion of the period that the first word line is activated based at least in part on activating the first word line, wherein precharging the first digit line is based at least in part on coupling the second digit line with the first digit line.

7. The method of claim 6, wherein the second digit line is coupled with a second word line that is inactive during an access operation performed on the ferroelectric memory cell.

8. The method of claim 6, wherein the second digit line is associated with a portion of a memory device that is inactive during an access operation performed on the ferroelectric memory cell.

9. The method of claim 8, wherein a first array corresponds to a first group of ferroelectric memory cells in a first deck and a second array corresponds to a second group of ferroelectric memory cells in a second deck.

10. The method of claim 6, wherein the second digit line is coupled with the first digit line using a transistor.

11. The method of claim 6, further comprising:
decoupling the second digit line from the first digit line based at least in part on precharging the first digit line to the first voltage.

12. The method of claim 11, further comprising:
coupling a capacitor with the first digit line configured to precharge the first digit line to a second voltage based at least in part on decoupling the second digit line from the first digit line.

13. The method of claim 6, further comprising:
precharging the first digit line to a second voltage by coupling the first digit line with a capacitor configured to precharge the first digit line to the second voltage associated with the second digit line based at least in part on precharging the first digit line to the first voltage.

14. The method of claim 6, further comprising:
detecting a charge of a capacitor configured to precharge the first digit line from the first voltage to a second voltage; and
identifying a logic state stored on the ferroelectric memory cell based at least in part on detecting the charge of the capacitor.

15. An electronic memory apparatus, comprising:
a ferroelectric memory cell selected to be accessed during an access operation;
a first digit line configured to couple the ferroelectric memory cell with a sense component during at least a portion of the access operation;
a precharge circuit that is configured to precharge the first digit line by supplying an amount of charge to the first digit line during a first portion of the access operation, wherein the ferroelectric memory cell is configured to be coupled with the first digit line during the first portion of the access operation; and
a second digit line different from the first digit line, wherein the precharge circuit is configured to precharge the second digit line with the amount of charge to a first voltage different from a second voltage on the first digit line during the first portion of the access operation.

16. The apparatus of claim 15, wherein the second digit line is associated with a portion of a memory device that is inactive during the access operation performed on the ferroelectric memory cell.

17. The apparatus of claim 15, further comprising a transistor configured to couple the first digit line with the second digit line during the first portion of the access operation.

18. The apparatus of claim 15, further comprising:
a capacitor configured to amplify a signal from the ferroelectric memory cell during a second portion of the access operation, wherein the capacitor is configured to compensate for a voltage difference between the first digit line and the second digit line after having received the amount of charge during the first portion of the access operation.

19. The apparatus of claim 15, further comprising:
an offset circuit configured to precharge a capacitor to a voltage during a third portion of the access operation, wherein the sense component is configured to use a reference voltage generated using the capacitor to distinguish whether a charge stored on the ferroelectric memory cell corresponds to a first logic state or a second logic state.

20. The apparatus of claim 15, further comprising a capacitor and an offset circuit within the sense component, wherein:
the capacitor, during a second portion of the access operation, is configured to capture a signal from the ferroelectric memory cell based at least in part on the first digit line being precharged during the first portion of the access operation; and
the capacitor, during a third portion of the access operation, is configured to capture a reference signal from the ferroelectric memory cell based at least in part on the offset circuit providing an offset to the capacitor, wherein the sense component is configured to use the reference signal to distinguish whether the signal from the ferroelectric memory cell captured during the second portion of the access operation corresponds to a first logic state or a second logic state.

21. A memory device, comprising:

a ferroelectric memory array comprising a ferroelectric memory cell configured to couple with a word line and a first digit line;

a controller coupled with the ferroelectric memory array, the controller configured to:

activate the word line for a period to couple the ferroelectric memory cell with the first digit line;

precharge the first digit line using an amount of charge to a first voltage during at least a portion of the period that the word line is activated; and couple a second digit line with the first digit line during at least the portion of the period that the word line is activated based at least in part on activating the word line, wherein precharging the first digit line is based at least in part on coupling the second digit line with the first digit line.

* * * * *